United States Patent
Hayashi (10) Patent No.: US 11,569,413 B2
(45) Date of Patent: Jan. 31, 2023

(54) METHOD FOR MANUFACTURING LIGHT-EMITTING ELEMENT

(71) Applicant: NICHIA CORPORATION, Anan (JP)

(72) Inventor: Seiichi Hayashi, Anan (JP)

(73) Assignee: NICHIA CORPORATION, Anan (JP)

(*) Notice: Subject to any disclaimer, the term of this patent is extended or adjusted under 35 U.S.C. 154(b) by 211 days.

(21) Appl. No.: 17/117,975

(22) Filed: Dec. 10, 2020

(65) Prior Publication Data

US 2021/0202790 A1 Jul. 1, 2021

(30) Foreign Application Priority Data

Dec. 27, 2019 (JP) .............................. JP2019-238037

(51) Int. Cl.
*H01L 33/02* (2010.01)
*H01L 33/00* (2010.01)
*H01L 33/32* (2010.01)

(52) U.S. Cl.
CPC ........ *H01L 33/0075* (2013.01); *H01L 33/025* (2013.01); *H01L 33/325* (2013.01)

(58) Field of Classification Search
CPC . H01L 33/007; H01L 33/0075; H01L 33/025; H01L 33/08; H01L 33/325; H01L 21/02458; H01L 21/0254; C30B 25/02; C30B 29/403
See application file for complete search history.

(56) References Cited

U.S. PATENT DOCUMENTS

| | | | |
|---|---|---|---|
| 2002/0022286 A1* | 2/2002 | Nikolaev | H01L 21/0259 438/46 |
| 2002/0167014 A1 | 11/2002 | Schlereth et al. | |
| 2004/0179563 A1 | 9/2004 | Hasegawa et al. | |
| 2010/0252835 A1* | 10/2010 | Horie | H01L 33/0075 257/E29.089 |

FOREIGN PATENT DOCUMENTS

| | | |
|---|---|---|
| JP | 2002-305327 A | 10/2002 |
| JP | 2003-513474 A | 4/2003 |
| JP | 2005-019874 A | 1/2005 |
| JP | 2007-194664 A | 8/2007 |
| JP | 2011-192752 A | 9/2011 |
| JP | 2011-222812 A | 11/2011 |
| JP | 2014-175482 A | 9/2014 |
| JP | 2019-087710 A | 6/2019 |

* cited by examiner

*Primary Examiner* — Matthew C Landau
*Assistant Examiner* — Dmitriy Yemelyanov
(74) *Attorney, Agent, or Firm* — Foley & Lardner LLP (57) ABSTRACT

A method includes: introducing a gas including gallium, an ammonia gas, and a gas including a p-type impurity to a reactor and forming a first p-type nitride semiconductor layer on a first light-emitting layer in a state in which the reactor has been heated to a first temperature; lowering a temperature of the reactor from the first temperature to a second temperature; introducing an ammonia gas with a first flow rate to the reactor and increasing the temperature of the reactor from the second temperature to a third temperature; and introducing a gas including gallium, an ammonia gas with a second flow rate, and a gas including an n-type impurity to the reactor, and forming a second n-type nitride semiconductor layer on the first p-type nitride semiconductor layer in a state in which the reactor has been heated to the third temperature.

11 Claims, 10 Drawing Sheets

METHOD FOR MANUFACTURING LIGHT-EMITTING ELEMENT

CROSS-REFERENCE TO RELATED APPLICATION

This application claims priority to Japanese Patent Application No. 2019-238037, filed on Dec. 27, 2019, the disclosure of which is hereby incorporated by reference in its entirety.

BACKGROUND

The present disclosure relates to a method for manufacturing a light-emitting element.

Japanese Patent Publication No. 2003-513474 discusses a semiconductor light-emitting diode in which an np-type tunnel junction portion is provided between two photoactive regions, and the np-type tunnel junction portion is made of a doped layer of the $n^+$-type and a doped layer of the $p^+$-type adjacent to the $n^+$-type doped layer. In such a semiconductor light-emitting diode, it is desirable to form the tunnel junction portion while maintaining good crystallinity of the $n^+$-type layer and the $p^+$-type layer of the tunnel junction portion that are doped with high impurity concentrations. There is a risk that degradation of the crystallinity of the semiconductor layer in the tunnel junction portion may cause degradation of the crystallinity of the semiconductor layers stacked on the tunnel junction portion.

SUMMARY

The present disclosure is directed to a method for manufacturing a light-emitting element in which degradation of the crystallinity of semiconductor layers when stacking the semiconductor layers may be suppressed.

According to one embodiment of the present disclosure, a light-emitting element includes a first stacked part and a second stacked part. The first stacked part includes a first n-type nitride semiconductor layer, a first light-emitting layer, and a first p-type nitride semiconductor layer. The second stacked part is formed on the first stacked part and includes a second n-type nitride semiconductor layer, a second light-emitting layer, and a second p-type nitride semiconductor layer. A method for manufacturing the light-emitting element includes: introducing a gas including gallium, an ammonia gas, and a gas including a p-type impurity to a reactor and forming the first p-type nitride semiconductor layer on the first light-emitting layer in a state in which the reactor has been heated to a first temperature; after the step of forming the first p-type nitride semiconductor layer, lowering a temperature of the reactor from the first temperature to a second temperature that is less than the first temperature; introducing an ammonia gas at a first flow rate to the reactor and increasing the temperature of the reactor from the second temperature to a third temperature that is greater than the second temperature; and introducing a gas including gallium, an ammonia gas at a second flow rate, and a gas including an n-type impurity to the reactor, and forming the second n-type nitride semiconductor layer on the first p-type nitride semiconductor layer in a state in which the reactor has been heated to the third temperature. The first flow rate is less than the second flow rate.

According to another embodiment of the present disclosure, a light-emitting element includes a first stacked part and a second stacked part. The first stacked part includes a first n-type nitride semiconductor layer, a first light-emitting layer, and a first p-type nitride semiconductor layer. The second stacked part is formed on the first stacked part and includes a second n-type nitride semiconductor layer, a second light-emitting layer, and a second p-type nitride semiconductor layer. A method for manufacturing the light-emitting element includes: introducing a gas including gallium, an ammonia gas, and a gas including a p-type impurity to a reactor and forming the first p-type nitride semiconductor layer on the first light-emitting layer in a state in which the reactor has been heated to a first temperature; introducing an ammonia gas at a first flow rate and a nitrogen gas to the reactor in a state in which the reactor is held at the first temperature; and subsequently introducing a gas including gallium, an ammonia gas at a second flow rate, and a gas including an n-type impurity to the reactor, and forming the second n-type nitride semiconductor layer on the first p-type nitride semiconductor layer, the first flow rate being less than the second flow rate.

According to certain embodiments, a method for manufacturing a light-emitting element may allow for degradation of the crystallinity of semiconductor layers when stacking the semiconductor layers to be suppressed.

DETAILED DESCRIPTION

Embodiments will now be described with reference to the drawings. The same components in the drawings are labeled with the same reference numerals.

Figure 1:
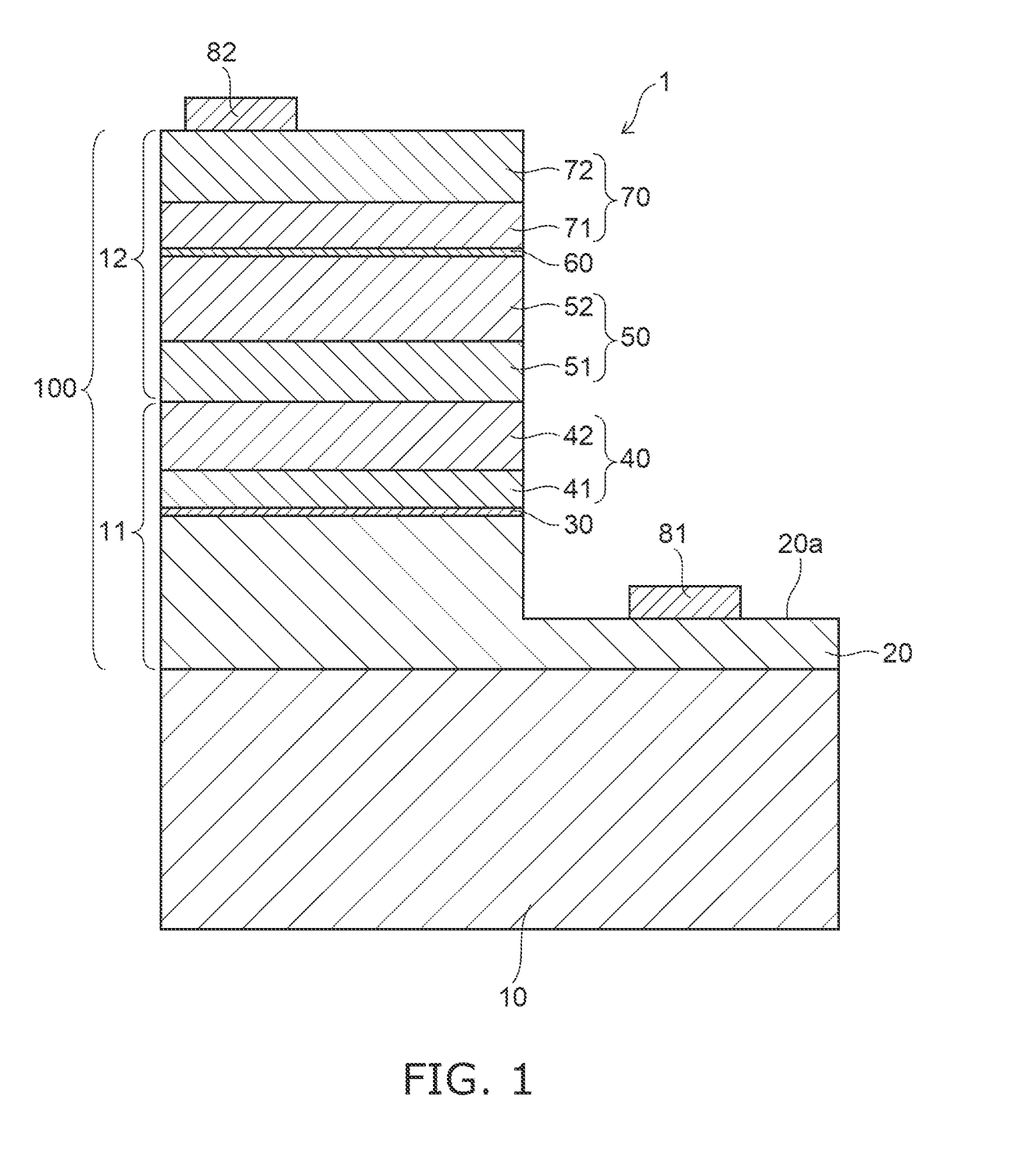
FIG. 1 is a schematic cross-sectional view of a light-emitting element according to an embodiment of the invention.

FIG. 1 is a schematic cross-sectional view of a light-emitting element 1 of an embodiment of the invention.

The light-emitting element 1 of the embodiment includes a substrate 10, a semiconductor stacked body 100 provided on the substrate 10, an n-side electrode 81, and a p-side electrode 82.

The semiconductor stacked body 100 is a stacked body in which multiple semiconductor layers made of nitride semiconductors are stacked. In the specification, "nitride semiconductor" includes all compositions of semiconductors of the chemical formula $In_xAl_yGa_{1-x-y}N$ ($0 \leq x \leq 1$, $0 \leq y \leq 1$, and $x+y \leq 1$) for which the composition ratios x and y are changed within the ranges respectively.

The semiconductor stacked body 100 includes a first stacked part 11 provided on the substrate 10, and a second stacked part 12 provided on the first stacked part 11.

The material of the substrate 10 is, for example, sapphire, silicon, SiC, GaN, etc.

The first stacked part 11 includes a first n-type nitride semiconductor layer 20 provided on the substrate 10, a first light-emitting layer 30 provided on the first n-type nitride semiconductor layer 20, and a first p-type nitride semiconductor layer 40 provided on the first light-emitting layer 30.

The first n-type nitride semiconductor layer 20 includes gallium nitride (GaN) and is doped with, for example, silicon (Si) as an n-type impurity. The first n-type nitride semiconductor layer 20 also may include indium (In) or aluminum (Al). For example, the Si concentration of the first n-type nitride semiconductor layer 20 that includes Si as the n-type impurity is not less than $1\times10^{18}/cm^3$ and not more than $1\times10^{20}/cm^3$.

The first p-type nitride semiconductor layer 40 includes gallium nitride (GaN) and is doped with, for example, magnesium (Mg) as a p-type impurity. The first p-type nitride semiconductor layer 40 also may include indium (In) or aluminum (Al).

The first p-type nitride semiconductor layer 40 includes a first p-type layer 41 provided on the first light-emitting layer 30, and a second p-type layer 42 provided on the first p-type layer 41. The p-type impurity concentration of the second p-type layer 42 is greater than the p-type impurity concentration of the first p-type layer 41. The first p-type nitride semiconductor layer 40 may include a semiconductor layer made of undoped gallium nitride. For example, the Mg concentration of the first p-type layer 41 that includes Mg as the p-type impurity is not less than $5\times10^{19}/cm^3$ and not more than $5\times10^{20}/cm^3$.

The first light-emitting layer 30 is provided between the first n-type nitride semiconductor layer 20 and the first p-type layer 41 of the first p-type nitride semiconductor layer 40. For example, the first light-emitting layer 30 has a multi-quantum well structure including multiple well layers and multiple barrier layers. The multiple well layers include, for example, InGaN. The multiple barrier layers include, for example, GaN.

The second stacked part 12 includes a second n-type nitride semiconductor layer 50 provided on the first p-type nitride semiconductor layer 40, a second light-emitting layer 60 provided on the second n-type nitride semiconductor layer 50, and a second p-type nitride semiconductor layer 70 provided on the second light-emitting layer 60.

The second n-type nitride semiconductor layer 50 includes gallium nitride (GaN) and is doped with, for example, silicon (Si) or germanium (Ge) as an n-type impurity. Also, the second n-type nitride semiconductor layer 50 may include indium (In) or aluminum (Al).

The second n-type nitride semiconductor layer 50 includes a first n-type layer 51 provided on the second p-type layer 42 of the first stacked part 11, and a second n-type layer 52 provided on the first n-type layer 51. The n-type impurity concentration of the first n-type layer 51 is greater than the n-type impurity concentration of the second n-type layer 52. For example, the Si concentration of the second n-type layer 52 that includes Si as the n-type impurity is not less than $5\times10^{19}/cm^3$ and not more than $2\times10^{21}/cm^3$.

The second p-type nitride semiconductor layer 70 includes gallium nitride (GaN) and is doped with, for example, magnesium (Mg) as a p-type impurity. Also, the second p-type nitride semiconductor layer 70 may include indium (In) or aluminum (Al).

The second p-type nitride semiconductor layer 70 includes a third p-type layer 71 provided on the second light-emitting layer 60, and a fourth p-type layer 72 provided on the third p-type layer 71. The p-type impurity concentration of the fourth p-type layer 72 is greater than the p-type impurity concentration of the third p-type layer 71. The second p-type nitride semiconductor layer 70 may include a semiconductor layer made of undoped gallium nitride. For example, the Mg concentration of the third p-type layer 71 that includes Mg as the p-type impurity is not less than $1\times10^{18}/cm^3$ and not more than $1\times10^{20}/cm^3$. For example, the Mg concentration of the fourth p-type layer 72 that includes Mg as the p-type impurity is not less than $1\times10^{20}/cm^3$ and not more than $2\times10^{21}/cm^3$.

The second light-emitting layer 60 is provided between the second n-type layer 52 of the second n-type nitride semiconductor layer 50 and the third p-type layer 71 of the second p-type nitride semiconductor layer 70. For example, the second light-emitting layer 60 has a multi-quantum well structure including multiple well layers and multiple barrier layers. The well layers and the barrier layers of the second light-emitting layer 60 include semiconductor layers similar to those of the first light-emitting layer 30 described above.

The p-side electrode 82 is provided on the fourth p-type layer 72 of the second p-type nitride semiconductor layer 70, and the p-side electrode 82 is electrically connected to the fourth p-type layer 72. The first n-type nitride semiconductor layer 20 includes an n-contact surface 20a where the first light-emitting layer 30, the first p-type nitride semiconductor layer 40, the second n-type nitride semiconductor layer 50, the second light-emitting layer 60, and the second p-type nitride semiconductor layer 70 are not provided. The n-side electrode 81 is provided on the n-contact surface 20a, and the n-side electrode 81 is electrically connected to the first n-type nitride semiconductor layer 20.

A forward voltage is applied between the p-side electrode 82 and the n-side electrode 81. At this time, a forward voltage is applied between the first p-type nitride semiconductor layer 40 and the first n-type nitride semiconductor layer 20 of the first stacked part 11, and the first light-emitting layer 30 emits light due to the holes and the electrons supplied to the first light-emitting layer 30. A forward voltage also is applied between the second p-type nitride semiconductor layer 70 and the second n-type nitride semiconductor layer 50 of the second stacked part 12, and the second light-emitting layer 60 emits light due to the holes and the electrons supplied to the second light-emitting layer 60. That is, the first light-emitting layer 30 and the second light-emitting layer 60 emit light due to the potential described above being applied between the p-side electrode 82 and the n-side electrode 81.

The light emission peak wavelength of the first light-emitting layer 30 and the light emission peak wavelength of the second light-emitting layer 60 are, for example, not less than 430 nm and not more than 540 nm. The first light-emitting layer 30 and the second light-emitting layer 60 emit blue light and/or green light. By stacking the second light-emitting layer 60 on the first light-emitting layer 30, compared to a light-emitting element that includes one light-emitting layer, the output per unit area can be increased. The light emission peak wavelength of the first light-emitting layer 30 and the light emission peak wavelength of the second light-emitting layer 60 may be different.

When a positive potential is applied to the p-side electrode 82 and a potential (e.g., a negative potential) that is less than that of the p-side electrode 82 is applied to the n-side electrode 81, a reverse voltage is applied between the second p-type layer 42 of the first stacked part 11 and the first n-type layer 51 of the second stacked part 12. Therefore, the current between the second p-type layer 42 and the first n-type layer 51 utilizes a tunnel effect. That is, a current flows due to electrons tunneling from the valence band of the second p-type layer 42 to the conduction band of the first n-type layer 51.

To obtain such a tunnel effect, a p-n junction is formed of the second p-type layer 42 that is doped with a high-concentration p-type impurity and the first n-type layer 51 that is doped with a high-concentration n-type impurity.

Then, the gradient of the potential of the depletion layer formed by the second p-type layer 42 and the first n-type layer 51 becomes steep, and the width of the depletion layer narrows. By such a structure, the electrons of the valence band of the second p-type layer 42 can move through the depletion layer formed by the second p-type layer 42 and the first n-type layer 51 and can move to the conduction band of the first n-type layer 51.

For example, the Si concentration of the first n-type layer 51 that includes Si as the n-type impurity is not less than $5\times10^{19}/cm^3$ and not more than $2\times10^{21}/cm^3$. The Mg concentration of the second p-type layer 42 that includes Mg as the p-type impurity is not less than $1\times10^{20}/cm^3$ and not more than $5\times10^{21}/cm^3$. The width of the depletion layer formed by such a first n-type layer 51 and such a second p-type layer 42 is, for example, not less than 5 nm and not more than 8 nm.

Because the two light-emitting layers of the first light-emitting layer 30 and the second light-emitting layer 60 are stacked in the semiconductor stacked body 100 in the light-emitting element 1 of the embodiment, the output per unit area can be increased compared to a light-emitting element that includes one light-emitting layer.

FIGS. 2 to 11 are schematic cross-sectional views showing a method for manufacturing the light-emitting element 1 of the embodiment. The layers of the semiconductor stacked body 100 described above are epitaxially grown on the substrate 10 by MOCVD (metal organic chemical vapor deposition) in a reactor of which the pressure and the temperature can be adjusted.

Figure 2:
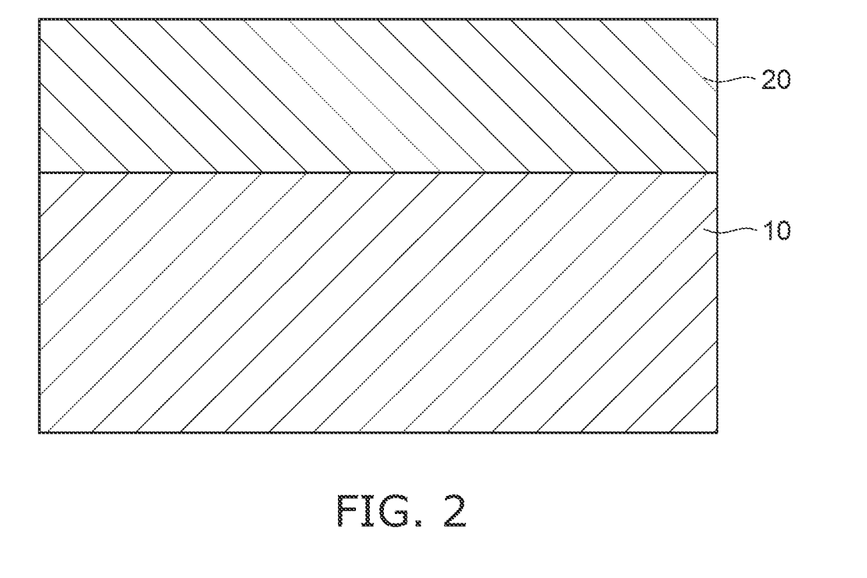
FIG. 2 to FIG. 11 are schematic cross-sectional views showing a method for manufacturing the light-emitting element according to an embodiment of the invention.
Figure 3:
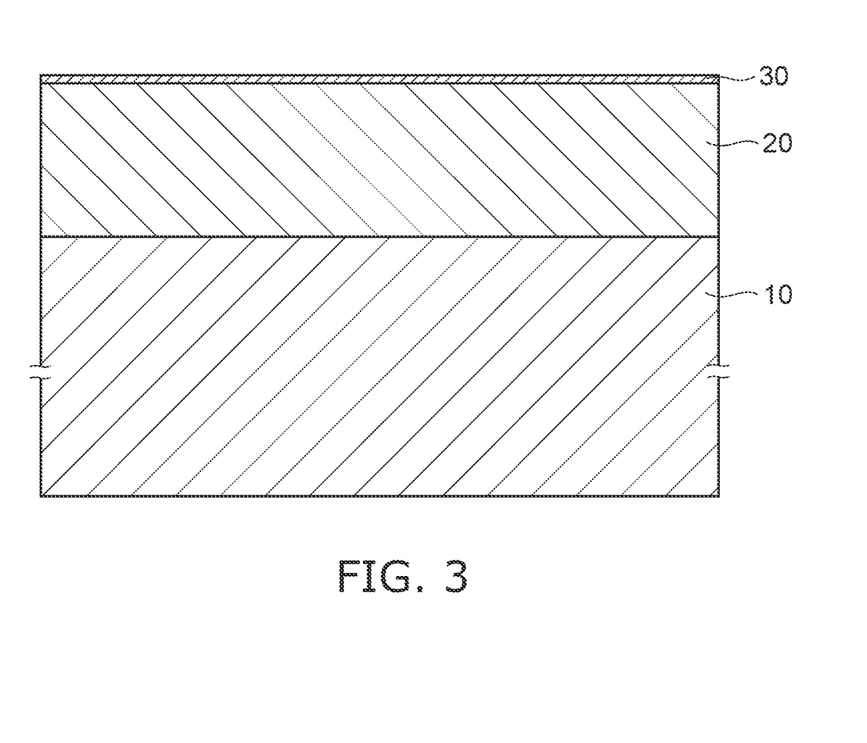
Figure 4:
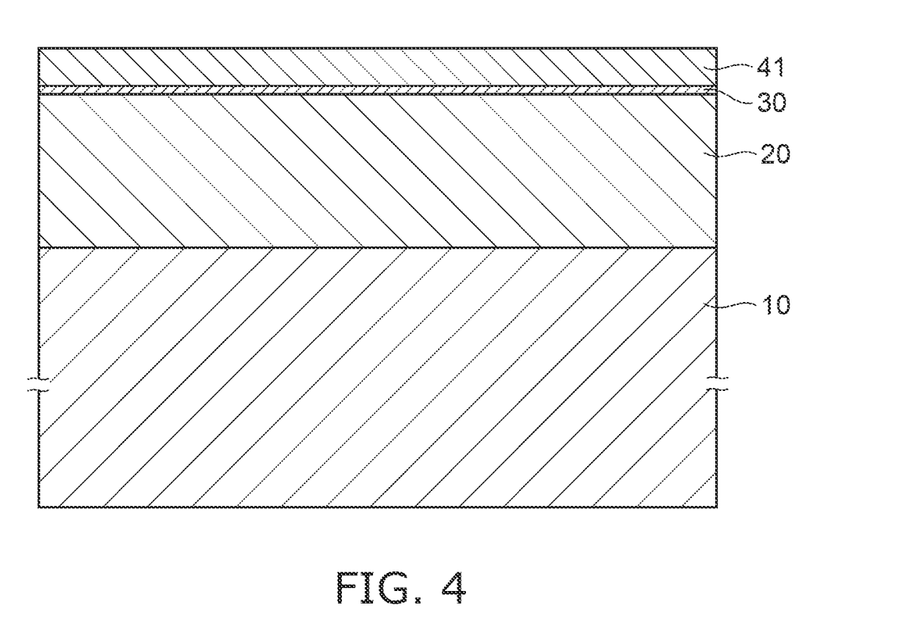
Figure 5:
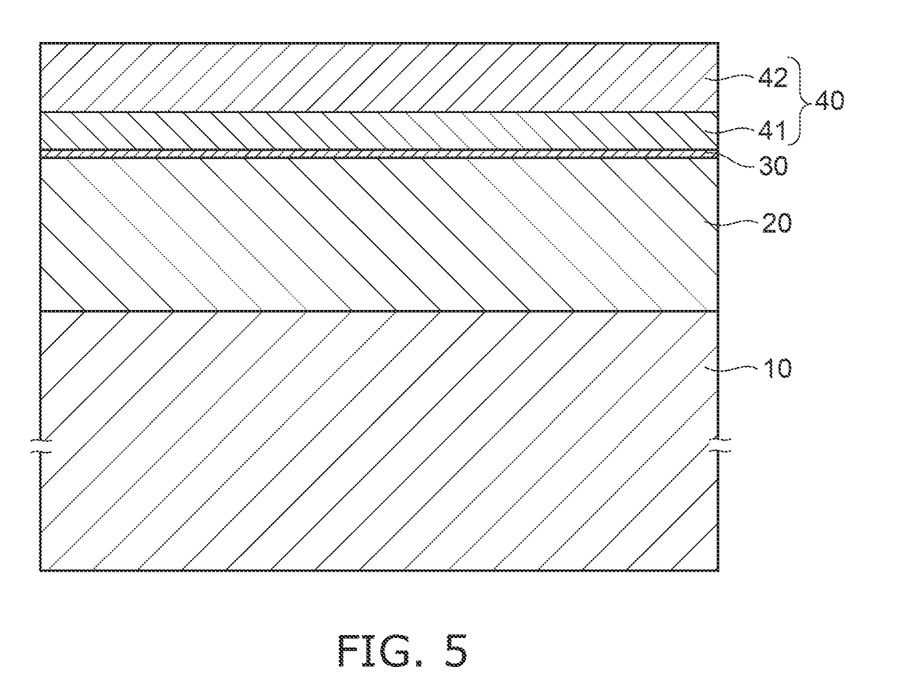
Figure 6:
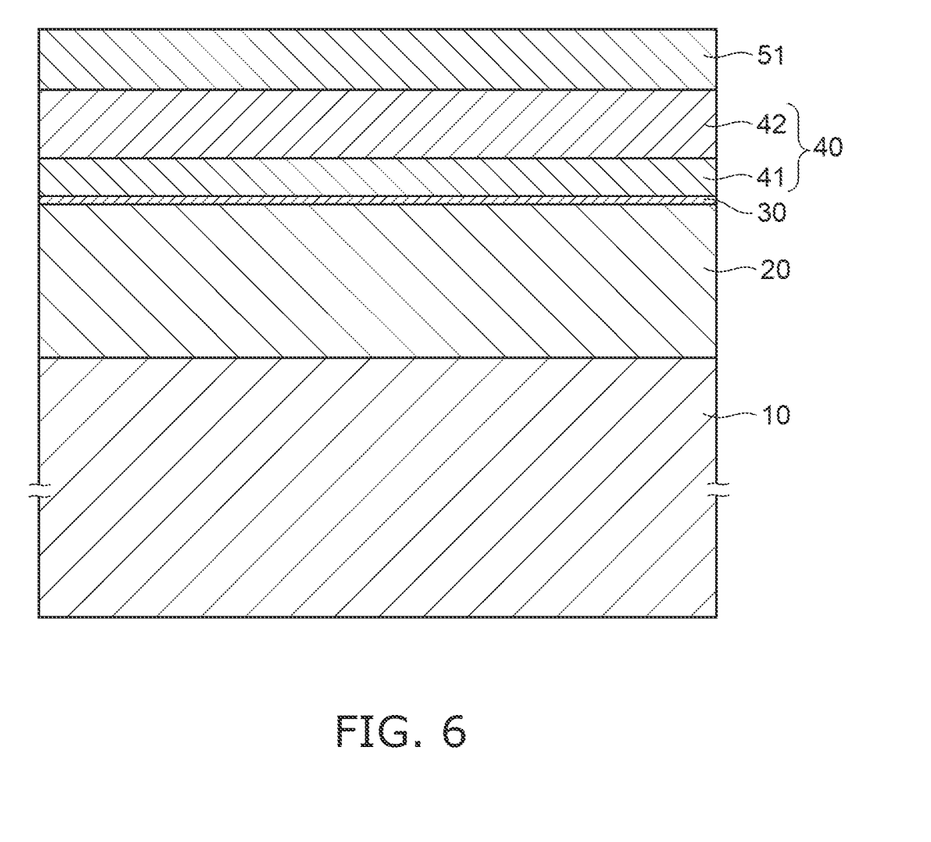
Figure 7:
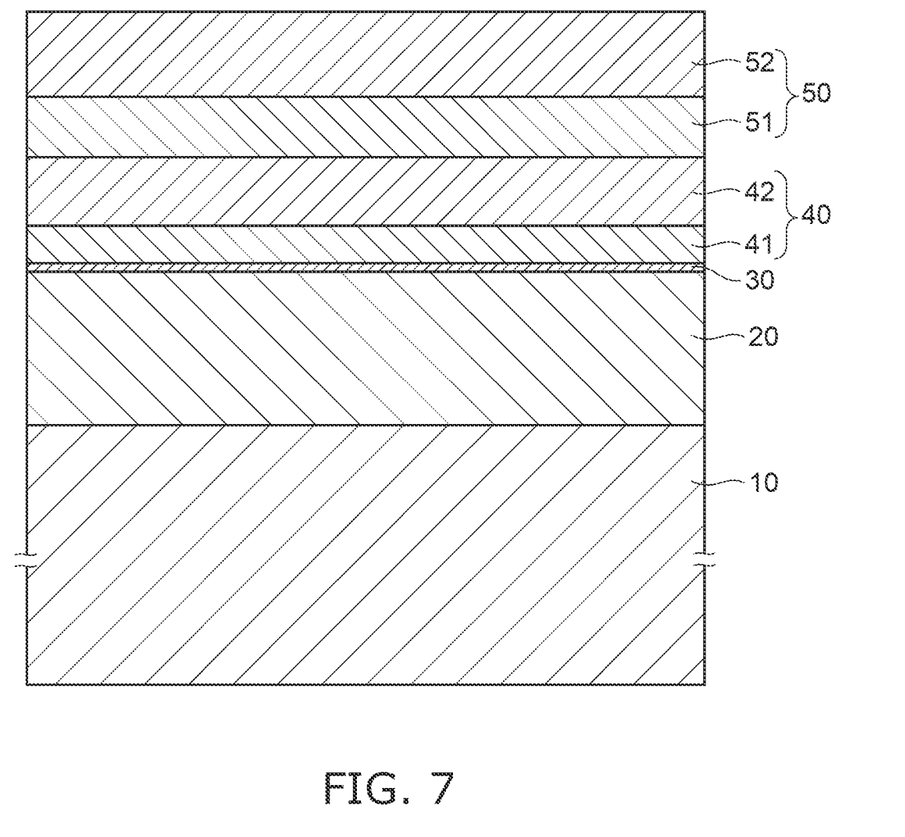
Figure 8:
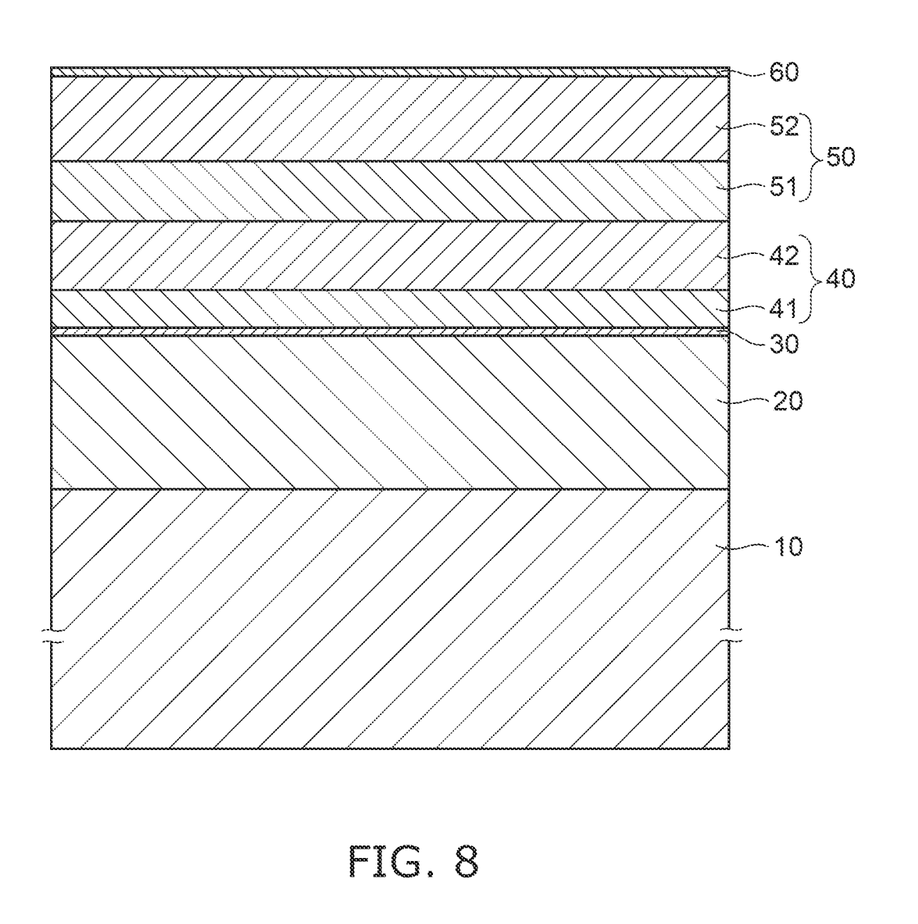
Figure 9:
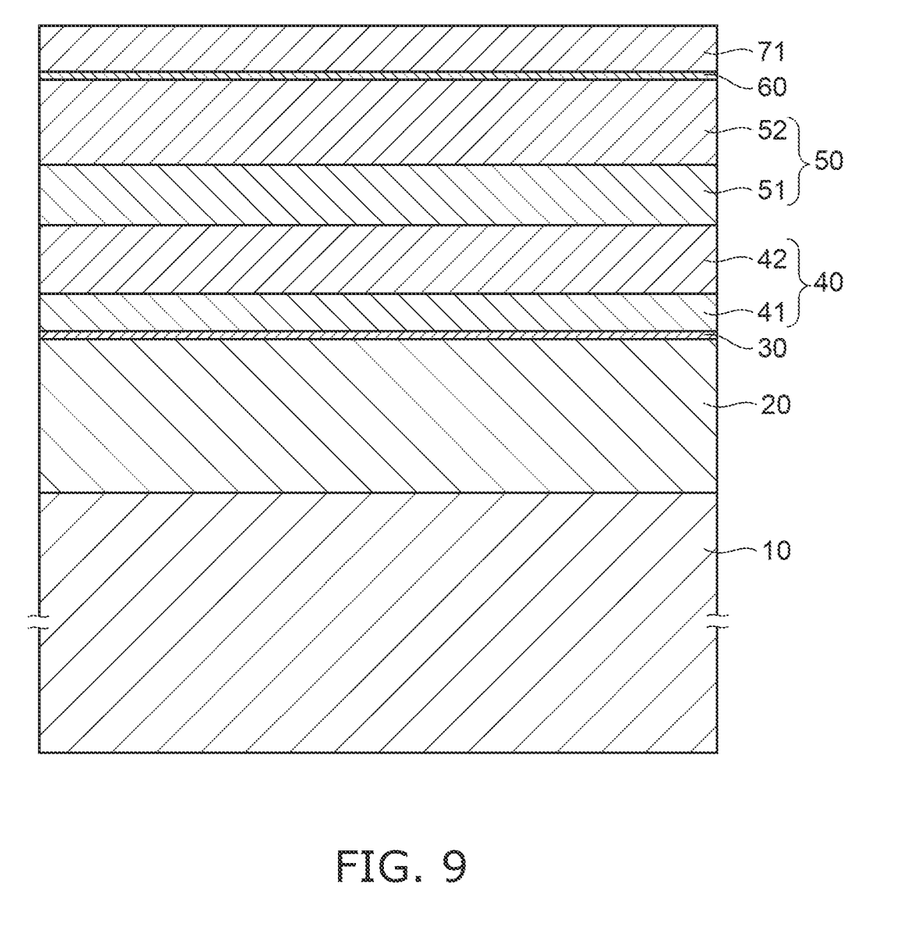
Figure 10:
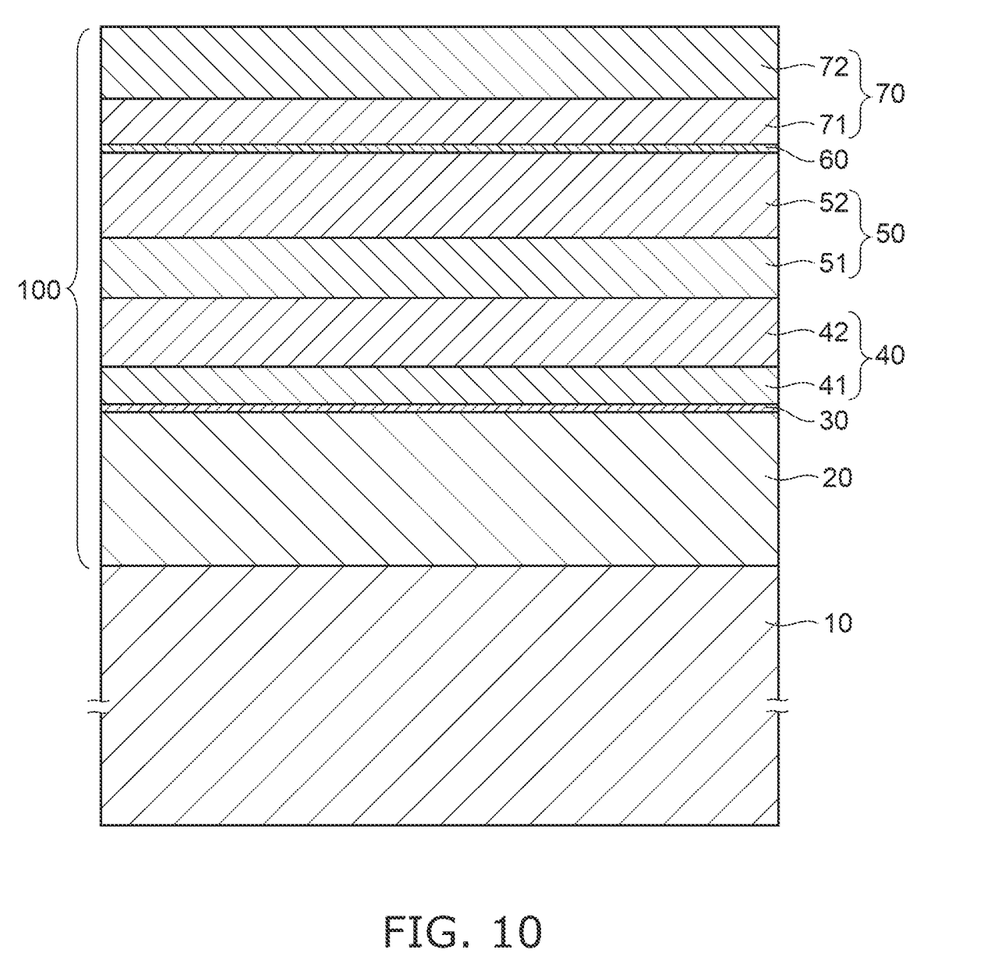

First, as shown in FIG. 2, the first n-type nitride semiconductor layer 20 is formed on the substrate 10. As shown in FIG. 3, the first light-emitting layer 30 is formed on the first n-type nitride semiconductor layer 20. As shown in FIG. 4, the first p-type layer 41 is formed on the first light-emitting layer 30. As shown in FIG. 5, the second p-type layer 42 is formed on the first p-type layer 41. As shown in FIG. 6, the first n-type layer 51 is formed on the second p-type layer 42. As shown in FIG. 7, the second n-type layer 52 is formed on the first n-type layer 51. As shown in FIG. 8, the second light-emitting layer 60 is formed on the second n-type layer 52. As shown in FIG. 9, the third p-type layer 71 is formed on the second light-emitting layer 60. As shown in FIG. 10, the fourth p-type layer 72 is formed on the third p-type layer 71. Thus, the first stacked part 11 and the second stacked part 12 are formed on the substrate 10.

Figure 11:
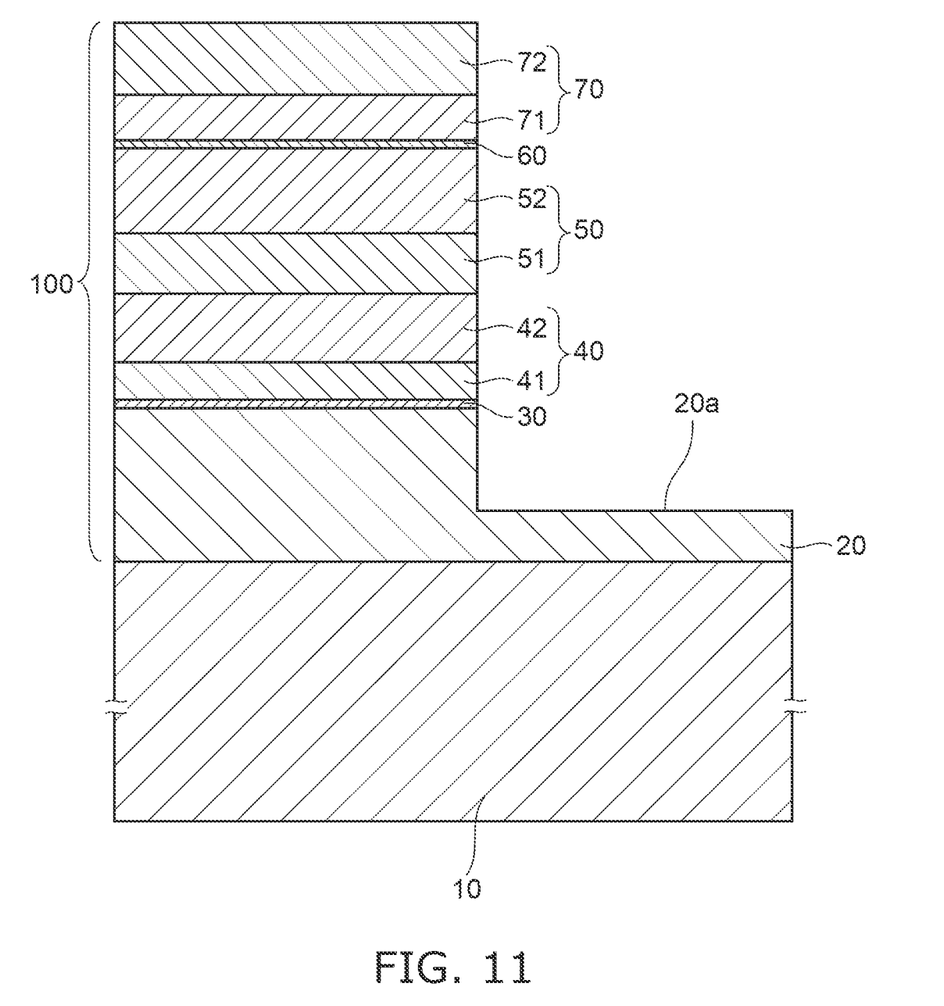

Subsequently, as shown in FIG. 11, the n-contact surface 20a is formed by exposing a portion of the first n-type nitride semiconductor layer 20 by removing a portion of the semiconductor stacked body 100.

Subsequently, as shown in FIG. 1, the p-side electrode 82 is formed on the fourth p-type layer 72, and the n-side electrode 81 is formed on the n-contact surface 20a.

A method for forming the first p-type nitride semiconductor layer 40 and the second n-type nitride semiconductor layer 50 will now be described in detail.

After forming the first light-emitting layer 30, a carrier gas, a gas including gallium (Ga), an ammonia ($NH_3$) gas, and a gas including magnesium as a p-type impurity are introduced to the reactor, and a GaN layer that is doped with magnesium is formed as the first p-type nitride semiconductor layer 40 on the first light-emitting layer 30 in a state in which the reactor has been heated to a first temperature.

When forming the first p-type nitride semiconductor layer 40, the gas that includes gallium is, for example, a TMG (trimethylgallium) gas or a TEG (triethylgallium) gas. The carrier gas is, for example, a nitrogen ($N_2$) gas. The first temperature (the setting value or the actual measured value) is, for example, not less than 900° C. and not more than 1000° C.

The first p-type layer 41, and the second p-type layer 42 that has a higher p-type impurity concentration than the first p-type layer 41, are formed in order on the first light-emitting layer 30 as the first p-type nitride semiconductor layer 40.

After forming the first p-type nitride semiconductor layer 40, the temperature of the reactor is lowered from the first temperature to a second temperature that is less than the first temperature. The second temperature is, for example, room temperature.

After lowering the temperature of the reactor from the first temperature to the second temperature, the gases that were introduced to the reactor when forming the first p-type nitride semiconductor layer 40 are replaced with a nitrogen gas. Thereby, the gas that includes the p-type impurity (Mg) and remains in the reactor is removed from the reactor.

Subsequently, an ammonia gas is introduced in addition to the nitrogen gas to the reactor, and the temperature of the reactor is heated from the second temperature to a third temperature that is greater than the second temperature. The third temperature (the setting value or the actual measured value) is, for example, not less than 900° C. and not more than 1000° C.

In the period of heating the reactor from the second temperature to the third temperature, the nitrogen gas and the ammonia gas are introduced without introducing a gas including gallium, a gas including an n-type impurity, or a gas including a p-type impurity to the reactor. At this time, the flow rate (a first flow rate) of the ammonia gas is less than the flow rate of the nitrogen gas. In the period of heating the reactor from the second temperature to the third temperature, for example, the first flow rate of the ammonia gas is not less than 2 slm and not more than 4 slm, and the flow rate of the nitrogen gas is not less than 30 slm and not more than 400 slm. For example, it is favorable for the proportion of the ammonia gas of the first flow rate to the total amount of the ammonia gas and the nitrogen gas in the reactor to be not less than 0.5% and not more than 10%, and more favorably not less than 1% and not more than 5%.

Continuing, a carrier gas, a gas including gallium, an ammonia gas, and a gas including silicon as an n-type impurity are introduced to the reactor, and a GaN layer that is doped with silicon is formed as the second n-type nitride semiconductor layer 50 on the first p-type nitride semiconductor layer 40 in a state in which the reactor has been heated to the third temperature.

When forming the second n-type nitride semiconductor layer 50, the gas that includes gallium is, for example, a TMG gas or a TEG gas; the carrier gas is, for example, a nitrogen gas.

As the second n-type nitride semiconductor layer 50, the first n-type layer 51, and the second n-type layer 52 that has a lower n-type impurity concentration than the first n-type layer 51, are formed in order on the second p-type layer 42. The second p-type layer 42 and the first n-type layer 51 form a p-n junction. For example, the thickness of the second p-type layer 42 is not less than 15 nm and not more than 20 nm. For example, the thickness of the first n-type layer 51 is not less than 10 nm and not more than 40 nm.

The flow rate (the first flow rate) of the ammonia gas introduced to the reactor when heating the reactor from the second temperature to the third temperature is less than the flow rate (a second flow rate) of the ammonia gas introduced to the reactor when forming the second n-type nitride semiconductor layer 50.

Also, the first flow rate of the ammonia gas is less than the flow rate (a third flow rate) of the ammonia gas introduced to the reactor when forming the first p-type nitride semiconductor layer 40.

For example, the first flow rate is not less than 2 slm and not more than 4 slm. For example, the second flow rate is not less than 5 slm and 80 slm, and favorably not less than 10 slm and not more than 50 slm. For example, the third flow rate is not less than 5 slm and not more than 40 slm, and favorably not less than 10 slm and not more than 30 slm.

When the semiconductor stacked body 100 that includes the two light-emitting layers utilizing the tunnel effect is formed as in the light-emitting element 1 of the embodiment, the second p-type layer 42 undergoes thermal damage, and the flatness of the surface easily degrades in the heating process after the lowering described above, which is after forming the second p-type layer 42. If the flatness of the second p-type layer 42 degrades, the crystallinity degrades in the first n-type layer 51, which is grown using the second p-type layer 42 as a foundation. The degradation of the crystallinity of the tunnel junction portion between the second p-type layer 42 and the first n-type layer 51 causes the forward voltage of the light-emitting element 1 to increase. Also, if the crystallinity of the tunnel junction portion degrades, the crystallinity of the second light-emitting layer 60 grown on the second p-type layer 42 and the first n-type layer 51 also degrades, which reduces the output of the light-emitting element 1.

The side surfaces of pits that occur in the surface of the second p-type layer 42 when the second p-type layer 42 is grown have different crystal growth surfaces from the other semiconductor layers; therefore, GaN that has poor crystal quality is easily formed. It is estimated that the flatness of the surface of the second p-type layer 42 degrades because the GaN that is formed at the surface of the second p-type layer 42 with poor crystal quality decomposes and is removed in the heating described above.

According to the embodiment, the degradation of the surface flatness of the second p-type layer 42 can be suppressed by introducing the ammonia gas with the first flow rate to the reactor when heating the reactor from the second temperature to the third temperature. It is estimated that this is because the removal of the GaN having the poor crystal quality described above is suppressed by the ammonia gas introduced to the reactor when heating.

When forming the second n-type nitride semiconductor layer 50, the ammonia gas that is introduced to the reactor has the second flow rate that is greater than the first flow rate of the heating described above. Then, the second n-type nitride semiconductor layer 50 is grown from GaN made by bonding between nitrogen thermally decomposing from the ammonia gas and gallium thermally decomposing from the TMG gas or the TEG gas.

When forming the first p-type nitride semiconductor layer 40 as well, the ammonia gas that is introduced to the reactor has a third flow rate that is greater than the first flow rate of the heating described above. Then, the first p-type nitride semiconductor layer 40 is grown in an improved state in which the pits are easily filled with the GaN made by the bonding between nitrogen thermally decomposing from the ammonia gas and gallium thermally decomposing from the TMG gas or the TEG gas.

Here, a comparative example may be considered in which the ammonia gas is introduced to the reactor with the second flow rate when heating the reactor from the second temperature to the third temperature, and the second n-type nitride semiconductor layer 50 is formed as-is after the reactor is heated to the third temperature without changing the second flow rate of the ammonia gas introduced to the reactor. However, when the flow rate of the ammonia gas introduced to the reactor in the heating described above is relatively high as when forming the semiconductor layer, the decomposition of the GaN having the poor crystal quality in the pits described above is promoted by hydrogen thermally decomposing from the ammonia, and the surface flatness of the second p-type layer 42 degrades more easily. Conversely, when the flow rate of the ammonia gas introduced to the reactor in the heating is low, the supply of the nitrogen from the ammonia gas is insufficient; the decomposition of the GaN having poor crystal quality in the pits described above is promoted, and the surface flatness of the second p-type layer 42 degrades more easily. Therefore, it is favorable for the first flow rate of the ammonia gas introduced to the reactor when heating the reactor from the second temperature to the third temperature to be, for example, not less than 2 slm and not more than 4 slm, and more favorably not less than 2 slm and not more than 3 slm.

Figure 12A:
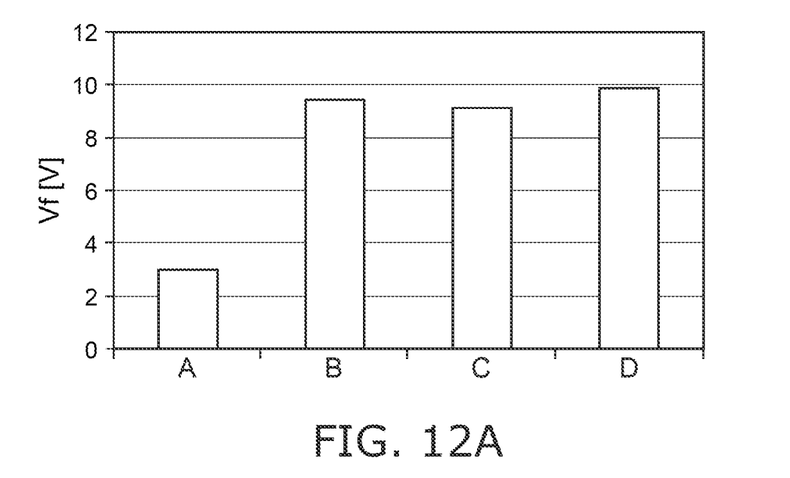
FIG. 12A is a graph comparing a forward voltage Vf for samples A, B, C, and D.
Figure 12B:
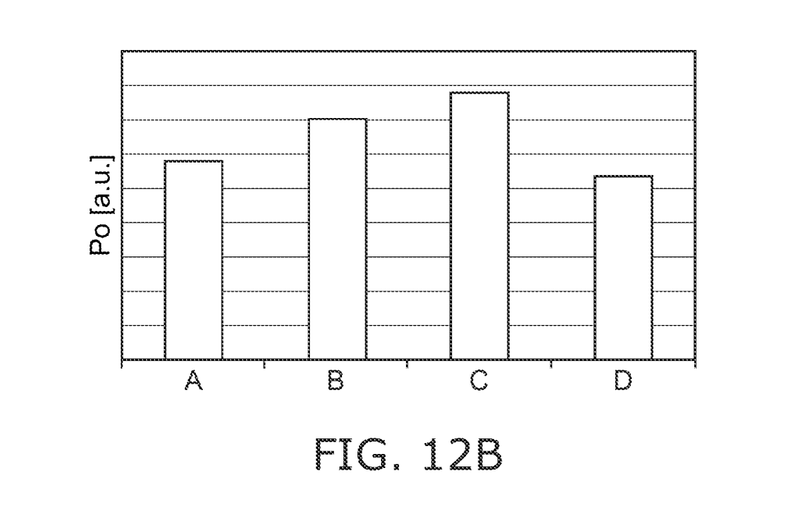
FIG. 12B is a graph comparing an output Po for the samples A, B, C, and D.

FIG. 12A is a graph comparing a forward voltage Vf for samples A, B, C, and D. The forward voltage Vf of FIG. 12A is the forward voltage (V) necessary to cause a forward current of 120 mA to flow in each of the samples A to D. FIG. 12B is a graph comparing an output Po for the samples A, B, C, and D. The output Po of FIG. 12B is the measured brightness for the samples A to D when a voltage is applied between the n-side electrode 81 and the p-side electrode 82 to cause a forward current of 120 mA to flow.

The sample A had the structure shown in FIG. 1 without the second stacked part 12. In other words, the sample A did not include a tunnel junction portion, and the light-emitting layer was only the first light-emitting layer 30.

The samples B to D had structures that include the first stacked part 11 and the second stacked part 12 on the substrate 10 as shown in FIG. 1, and differed only in the first flow rate of the ammonia gas introduced to the reactor when heating the reactor from the second temperature to the third temperature after forming the first p-type nitride semiconductor layer 40. The conditions for forming the first stacked part 11 on the substrate 10 in the samples B to D were the same as those of the sample A.

Specifically, the first stacked part 11 of the sample A was formed as follows.

The substrate 10 included a sapphire substrate. A buffer layer that was made of AlGaN was formed on the sapphire substrate. On the buffer layer, an undoped GaN layer, a GaN layer doped with Si, a modulation-doped layer including multiple GaN layers doped with modulated Si, a first superlattice layer in which a GaN layer and an InGaN layer were alternately stacked, and a first barrier layer were formed in this order as the first n-type nitride semiconductor layer 20. As the modulation-doped layer, an undoped GaN layer and a GaN layer doped with Si were alternately stacked; four of such pairs were formed, and then a GaN layer doped with Si was formed. As the first superlattice layer, an undoped GaN layer having a film thickness of about 2 nm and an undoped InGaN layer having a film thickness of about 1 nm were alternately stacked; twenty of such pairs were formed. As the first barrier layer, an InGaN layer doped with Si and an undoped GaN layer were formed in order. The Si concentration of the GaN layer doped with Si of the first n-type nitride semiconductor layer 20 was $1 \times 10^{19}/\text{cm}^3$.

As the first light-emitting layer 30, an undoped InGaN layer and an undoped GaN layer were alternately stacked; nine of such pairs were formed on the first n-type nitride semiconductor layer 20.

On the first light-emitting layer 30, an AlGaN layer doped with Mg, an undoped GaN layer, and a GaN layer doped with Mg were formed in this order as the first p-type nitride semiconductor layer 40. In the sample A, the Mg concentration of the GaN layer doped with Mg of the first p-type nitride semiconductor layer 40 was $3\times10^{20}/\text{cm}^3$.

For the samples B to D, the second stacked part 12 was formed on the first stacked part 11 as follows.

On the first p-type nitride semiconductor layer 40 of the first stacked part 11, a GaN layer doped with Si, a second superlattice layer in which a GaN layer and an InGaN layer are alternately stacked, and a second barrier layer were formed in this order as the second n-type nitride semiconductor layer 50. As the second superlattice layer, an undoped GaN layer having a film thickness of about 2 nm and an undoped InGaN layer having a film thickness of about 1 nm were alternately stacked; twenty of such pairs were formed. As the second barrier layer, an InGaN layer doped with Si and an undoped GaN layer were formed in this order. The GaN layer doped with Si of the second n-type nitride semiconductor layer 50 included a GaN layer heavily doped with Si and a GaN layer lightly doped with Si. The Si concentration of the GaN layer heavily doped with Si was $1\times10^{20}/\text{cm}^3$.

As the second light-emitting layer 60, an undoped InGaN layer and an undoped GaN layer were alternately stacked; nine of such pairs were formed on the second n-type nitride semiconductor layer 50.

On the second light-emitting layer 60, an AlGaN layer doped with Mg, an undoped GaN layer, and a GaN layer doped with Mg were formed in this order as the second p-type nitride semiconductor layer 70. The Mg concentration of the GaN layer doped with Mg of the second p-type nitride semiconductor layer 70 was $3\times10^{20}/\text{cm}^3$.

After forming the first p-type nitride semiconductor layer 40, when heating the reactor from the second temperature to the third temperature, the first flow rate of the ammonia gas of the sample B was set to 4 slm, the first flow rate of the ammonia gas of the sample C was set to 2 slm, and the first flow rate of the ammonia gas of the sample D was set to 0.5 slm.

The results of FIG. 12A show that Vf of the sample A was 3.02 V, Vf of the sample B was 9.44 V, Vf of the sample C was 9.12 V, and Vf of the sample D was 9.87 V. Among the structures that included the two layers of light-emitting layers (the samples B to D), the forward voltages Vf of the samples B and C were less than the forward voltage Vf of the sample D.

The results of FIG. 12B show that the outputs Po of the samples B and C were greater than the outputs Po of the samples A and D.

From the results of FIGS. 12A and 12B, it is favorable for the first flow rate described above to be not less than 2 slm and not more than 4 slm to realize a high output Po while suppressing the increase of the forward voltage Vf.

After forming the first p-type nitride semiconductor layer 40 in the state in which the reactor has been heated to the first temperature, the gases that include the p-type impurity (Mg) and remain in the reactor may be removed from the reactor by introducing the ammonia gas of the first flow rate and the nitrogen gas to the reactor in a state in which the reactor is held at the first temperature without lowering or heating.

Subsequently, the reactor is heated or lowered from the first temperature to the third temperature, and the second n-type nitride semiconductor layer 50 is formed on the first p-type nitride semiconductor layer 40 by introducing a gas including gallium, an ammonia gas of the second flow rate, and a gas including an n-type impurity to the reactor. The second n-type nitride semiconductor layer 50 may be formed on the first p-type nitride semiconductor layer 40 by introducing gases similar to those described above to the reactor in a state in which the first temperature is held.

In such a case as well, after forming the first p-type nitride semiconductor layer 40, an ammonia gas is introduced to the reactor with the first flow rate in the period of removing, from the reactor, the gases introduced to the reactor when forming the first p-type nitride semiconductor layer 40. The degradation of the surface flatness of the second p-type layer 42 can be suppressed thereby. As a result, the degradation of the crystallinity of the semiconductor layers that are stacked can be suppressed, and a high output can be realized while suppressing the increase of the forward voltage of the light-emitting element 1. In such a case as well, considering the results of FIGS. 12A and 12B, it is favorable for the first flow rate of the ammonia gas to be not less than 2 slm and not more than 4 slm.

Certain embodiments of the present invention have been described with reference to specific examples. However, the present invention is not limited to these specific examples. Based on the above-described embodiments, all embodiments that can be implemented with appropriately design modification by one skilled in the art are also within the scope of the present invention as long as the gist of the present invention is included. Further, one skilled in the art can conceive various modifications within the scope of the thought of the present invention, and the modifications fall within the scope of the present invention.

What is claimed is:

1. A method for manufacturing a light-emitting element that comprises a first stacked part and a second stacked part, the first stacked part comprising a first n-type nitride semiconductor layer, a first light-emitting layer, and a first p-type nitride semiconductor layer, the second stacked part being formed on the first stacked part and comprising a second n-type nitride semiconductor layer, a second light-emitting layer, and a second p-type nitride semiconductor layer, the method comprising:

introducing a gas comprising gallium, an ammonia gas, and a gas comprising a p-type impurity to a reactor and forming the first p-type nitride semiconductor layer on the first light-emitting layer in a state in which the reactor has been heated to a first temperature;

after the step of forming the first p-type nitride semiconductor layer, lowering a temperature of the reactor from the first temperature to a second temperature that is less than the first temperature;

introducing an ammonia gas at a first flow rate to the reactor and increasing the temperature of the reactor from the second temperature to a third temperature that is greater than the second temperature; and introducing a gas comprising gallium, an ammonia gas at a second flow rate, and a gas comprising an n-type impurity to the reactor, and forming the second n-type nitride semiconductor layer on the first p-type nitride semiconductor layer in a state in which the reactor has been heated to the third temperature, wherein the first flow rate is less than the second flow rate.

2. The method according to claim 1, further comprising:
after the step of lowering the temperature of the reactor from the first temperature to the second temperature, replacing the gases introduced to the reactor in the step of forming the first p-type nitride semiconductor layer with a nitrogen gas; and
wherein, in the step of increasing the temperature of the reactor from the second temperature to the third temperature, the ammonia gas is introduced to the reactor in addition to the nitrogen gas.

3. The method according to claim 1, wherein:
in the step of increasing the temperature of the reactor from the second temperature to the third temperature, the first flow rate is not less than 2 slm and not more than 4 slm.

4. The method according to claim 2, wherein:
in the step of increasing the temperature of the reactor from the second temperature to the third temperature, the first flow rate is not less than 2 slm and not more than 4 slm.

5. The method according to claim 1, wherein:
the first flow rate is less than a flow rate of the ammonia gas introduced to the reactor during the step of forming the first p-type nitride semiconductor layer.

6. The method according to claim 2, wherein:
the first flow rate is less than a flow rate of the ammonia gas introduced to the reactor during the step of forming the first p-type nitride semiconductor layer.

7. The method according to claim 4, wherein:
the first flow rate is less than a flow rate of the ammonia gas introduced to the reactor during the step of forming the first p-type nitride semiconductor layer.

8. The method according to claim 1, wherein:
the p-type impurity is magnesium, and
a magnesium concentration of the first p-type nitride semiconductor layer is not less than $5\times10^{19}/cm^3$ and not more than $2\times10^{21}/cm^3$.

9. The method according to claim 2, wherein:
the p-type impurity is magnesium, and
a magnesium concentration of the first p-type nitride semiconductor layer is not less than $5\times10^{19}/cm^3$ and not more than $2\times10^{21}/cm^3$.

10. The method according to claim 1, wherein:
the n-type impurity is silicon, and
a silicon concentration of the second n-type nitride semiconductor layer is not less than $1\times10^{20}/cm^3$ and not more than $5\times10^{21}/cm^3$.

11. The method according to claim 1, wherein:
the n-type impurity is silicon, and
a silicon concentration of the second n-type nitride semiconductor layer is not less than $1\times10^{20}/cm^3$ and not more than $5\times10^{21}/cm^3$.

* * * * *